United States Patent
Akamatsu

(10) Patent No.: US 10,074,443 B2
(45) Date of Patent: Sep. 11, 2018

(54) SEMICONDUCTOR DEVICE INCLUDING FUSE CIRCUIT

(71) Applicant: MICRON TECHNOLOGY, INC., Boise, ID (US)

(72) Inventor: Hiroshi Akamatsu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/816,889

(22) Filed: Nov. 17, 2017

(65) Prior Publication Data

US 2018/0075922 A1     Mar. 15, 2018

Related U.S. Application Data

(60) Continuation of application No. 15/651,969, filed on Jul. 17, 2017, now Pat. No. 9,865,359, which is a division of application No. 14/682,967, filed on Apr. 9, 2015, now Pat. No. 9,741,447.

(30) Foreign Application Priority Data

Apr. 23, 2014   (JP) ................................ 2014-088962

(51) Int. Cl.
    *G11C 17/18*        (2006.01)
    *G11C 29/00*        (2006.01)
    *G11C 17/16*        (2006.01)

(52) U.S. Cl.
    CPC .............. *G11C 17/18* (2013.01); *G11C 17/16* (2013.01); *G11C 29/76* (2013.01); *G11C 29/78* (2013.01)

(58) Field of Classification Search
    CPC .... G11C 29/785; G11C 29/808; G11C 29/846
    See application file for complete search history.

(56) References Cited

U.S. PATENT DOCUMENTS

| | | |
|---|---|---|
| 5,508,963 A | 4/1996 | Sawada et al. |
| 5,563,821 A | 10/1996 | Kumagai et al. |
| 6,272,056 B1 | 8/2001 | Ooishi |
| 6,272,057 B1 | 8/2001 | Koshikawa |
| 6,320,802 B1 | 11/2001 | Ohbayashi |
| 6,421,789 B1 | 7/2002 | Ooishi |
| 8,154,942 B1 | 4/2012 | Xiao et al. |
| 2001/0045581 A1 | 11/2001 | Sakata |
| 2002/0021600 A1 | 2/2002 | Tsuji |
| 2002/0054529 A1 | 5/2002 | Nishino et al. |
| 2002/0136070 A1 | 9/2002 | Ariki |
| 2002/0176287 A1* | 11/2002 | Hur ................. G11C 29/24 365/200 |
| 2002/0196681 A1 | 12/2002 | Tanizaki |
| 2005/0285862 A1 | 12/2005 | Noda et al. |

(Continued)

FOREIGN PATENT DOCUMENTS

JP     2010-277662     12/2010

*Primary Examiner* — Tuan T Nguyen
(74) *Attorney, Agent, or Firm* — Dorsey & Whitney LLP

(57) ABSTRACT

Disclosed here is a semiconductor device that comprises plurality of input nodes configured to be supplied with input signals, a decoder coupled to the input nodes, the decoder configured to decode the input signals and output decoded sepals, and a plurality of fuse circuits provided correspondingly with the decoded signals and configured to be programmed responsive to the decoded signals, respectively

20 Claims, 9 Drawing Sheets

(56) References Cited

U.S. PATENT DOCUMENTS

| | | | |
|---|---|---|---|
| 2006/0002204 A1* | 1/2006 | Nam | G11C 29/787 365/200 |
| 2009/0219747 A1 | 9/2009 | Hoefler et al. | |
| 2010/0328985 A1 | 12/2010 | Miura et al. | |
| 2013/0107603 A1 | 5/2013 | Huang et al. | |
| 2013/0286759 A1* | 10/2013 | Park | G11C 8/10 365/201 |
| 2015/0310926 A1 | 10/2015 | Akamatsu | |
| 2016/0042804 A1 | 2/2016 | Chen | |
| 2017/0316836 A1 | 11/2017 | Akamatsu | |

* cited by examiner

SEMICONDUCTOR DEVICE INCLUDING FUSE CIRCUIT

This application is a continuation of U.S. patent application Ser. No. 15/651,969, filed Jul. 17, 2017, issued as U.S. Pat. No. 9,865,359 on Jan. 9, 2018, which is a divisional of U.S. patent application Ser. No. 14/1682,967, filed Apr. 9, 2015, issued as U.S. Pat. No. 9,741,447 on Aug. 22, 2017, which claims the filing benefit of Japanese Patent Application No. 2014-088962 filed on Apr. 23, 2014. These applications and patent are incorporated by reference herein in their entirety and for all purposes.

BACKGROUND OF THE INVENTION

Field of the Invention

The present invention relates to a semiconductor device and, in particular, to a semiconductor device that replaces a defective memory cell with a redundant memory cell.

Description of Related Art

A semiconductor device, such as a DRAM (Dynamic Random Access Memory) or the like, is provided with a fuse element that holds address information of a defective memory cell. The address information of a defective memory cell held in the fuse element is compared with an input address, and a determination is made whether or not the memory cell indicated by the input address is a defective memory cell. If the memory cell indicated by the input address is a defective memory cell, the corresponding address may be saved by switching the access to a redundant memory cell.

In recent years, a fuse element such as an anti-fuse element or the like that is electrically programmable has been used as the fuse element for holding the address information of a defective memory cell. By using the anti-fuse element, it becomes possible to also save an address of a defective memory cell occurred even after a packaging process (Japanese Patent Application Laid Open No. 2010-277662).

SUMMARY

In one embodiment of the disclosure, there is provided a semiconductor device that comprises: a plurality of input nodes configured to be supplied with input signals; a decoder coupled to the input nodes, the decoder configured, to decode the input signals and output decoded signals; and a plurality of fuse circuits provided correspondingly with the decoded signals and configured to be programmed responsive to the decoded signals, respectively.

In another embodiment of the disclosure, there is provided a semiconductor device that comprises: a plurality of input terminals; and a plurality of fuse circuits configured to be programmed based on input signals respectively supplied to the input terminals, a number of the plurality of fuse circuits equal to or more than $(2^M-1)$, M equal to a number of the plurality of input terminals.

In another embodiment of the disclosure, there is provided a semiconductor device that comprises: a plurality of first input terminals; a plurality of first fuse circuits configured to be programmed based on first input signals respectively supplied to the first input terminals, a number of the plurality of first fuse circuits equal to or more than $(2^M-1)$, M equal to a number of the plurality of first input terminals; a plurality of second input terminals; and a plurality of second fuse circuits configured to be programmed based on second input signals respectively supplied to the second input terminals, a number of the plurality of second fuse circuits equal to or more than $(2^N-1)$, N equal to a number of the plurality of second input terminals.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be realized using the teachings of the present in and that the invention is not limited to the embodiments illustrated for explanatory purposes.

Figure 1:
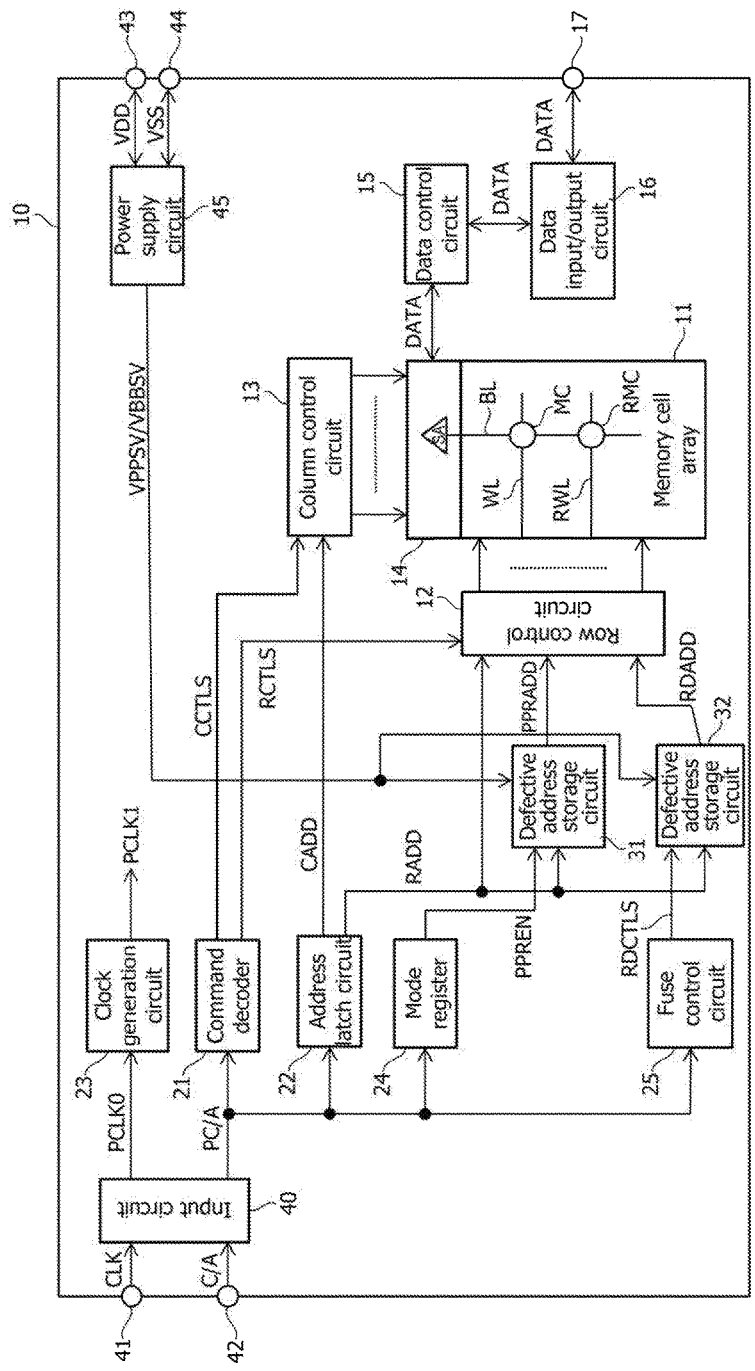
FIG. 1 is a block diagram showing a configuration of a semiconductor device according to an embodiment of the invention.

Referring now to FIG. 1, a semiconductor device 10 according to a first embodiment of the present invention includes a memory cell array 11. The memory cell array 11 is provided with a plurality of word lines WL and a plurality of bit lines BL that intersect with each other, with memory cells MC disposed at the intersections. Moreover, the memory cell array 11 is provided with a plurality of redundant word lines RWL, and redundant memory cells RMC are formed at the intersections between the redundant word lines RWL and the bit lines BL. The redundant word lines RWL are used to replace the word line WL having a defect. Thus since the memory cell MC connected to the defective word line WL is replaced by the redundant memory cell RMC connected to the redundant word line RWL, the corresponding address can be saved.

The selection of the word line WL and the redundant word line RWL is carried out by a row control circuit 12. The row control circuit 12 is controlled by a row control signal RCTLS outputted from a command decoder 21, and selects a predetermined word line WL in accordance with a row address RADD supplied thereto through an address latch circuit 22. Moreover, in the case when the row address RADD indicates address information of the word line WL having a defect, the row control circuit 12 selects a redundant word line RWL in place of the defective word line WL. The address information of the defective word line WL is held by defective address storage circuits 31 and 32. The defective address storage circuits 31 and 32 will be described later in detail.

The selection of the bit lines BL is carried out by a column control circuit 13. The column control circuit 13 is controlled by a column control signal CCTLS outputted from the command decoder 21, and selects a predetermined bit line BL in accordance with a column address CADD supplied thereto through the address latch circuit 22. The bit line BL is connected to a sense amplifier SA inside a sense circuit 14.

As shown in FIG. 1, the semiconductor device 10 includes a clock terminal 41 through which an external clock signal CLK is inputted and a command address terminal 42 through which an external command address signal C/A is inputted. The external clock signal CLK and the external command address signal C/A are supplied to an input circuit 40.

The input circuit 40 generates an internal clock signal PCLK0 based upon the external clock signal CLK, and supplies this to a clock generation circuit 23. The clock generation circuit 23 generates an internal clock signal PCLK1 that is timing-adjusted based upon the internal clock signal PCLK0, and supplies this to circuit blocks inside the semiconductor device 10. Thus, the respective circuit blocks inside the semiconductor device 10 carry out operations that are synchronized with the internal clock signal PCLK1.

The input circuit 40 generates an internal command address signal PC/A based upon the external command address signal C/A. The internal command address signal PC/A includes a command signal and an address signal, and the command signal is supplied to the command decoder 21, while the address signal is supplied to the address latch circuit 22.

In the case when the command signal represents an active command, the command decoder 21 activates the row control signal RCTLS. Thus, the row address RADD latched by the address latch circuit 22 is supplied to the row control circuit 12. Moreover, in the case when the command signal represents a read command or a write command, the command decoder 21 activates the column control signal CCTLS. Thus, the column address CADD latched by the address latch circuit 22 is supplied to the column control circuit 13.

Thus, at the time of the reading operation, data read out from the memory cell MC or the redundant memory cell RMC through the bit line BL is amplified by the sense amplifier SA, and the amplified data DATA is supplied to the data control circuit 15. The data control circuit 15 parallel/serial converts the data DATA, and transfers the data to a data input/output circuit 16. The data input/output circuit 16 externally outputs the data DATA through a data input/output terminal 17.

Moreover at the time of the writing operation, the data DATA inputted to the data input/output terminal 17 is supplied to the data control circuit 15 through the data input/output circuit 16. The data control circuit 15 serial/parallel converts the data DATA, and transfers the resulting data to the sense circuit 14. Thus, the inputted data DATA is written in the memory cell MC or the redundant memory cell RMC through the selected bit line BL.

In the case when the command signal indicates a mode register set command, the command decoder 21 rewrites the set value of the mode register 24. The mode register 24 is a register that sets a parameter indicating an operation mode of the semiconductor device 10. For example, in the case when a PPR enable (Post Package Repair Enable) is set in the mode register 24, the mode register 24 activates an enable signal PPREN. The enable signal PPREN is supplied to the defective address storage circuit 31. The defective address storage circuit 31 is a circuit for storing address information of a defective word line WL that occurs after a packaging process, which can be programmed on the user side. The number of addresses that can be stored in the defective address storage circuit 31 is limited, for example, set to one address per one bank.

Moreover, in the case when the internal command address signal PC/A indicates a predetermined program command, this is activated by the fuse control circuit 25 so that the fuse control signal RDCTLS is supplied to the defective address storage circuit 32. The defective address storage circuit 32 is a circuit for storing an address of a defective word line WL that occurs in a wafer state, and this can be programmed by the memory manufacturer at the time of delivery. The number of addresses that can be stored in the defective address storage circuit 32 is designed in accordance with the number of defective addresses that might occur in the production stage, and is prepared, for example, as addresses corresponding to several thousands.

A program electric potential VPPSV and a negative electric potential VBBSV are supplied to the defective address storage circuits 31 and 32. The program electric potential VPPSV and the negative electric potential VBBSV are respectively generated by a power supply circuit 45 based upon a power supply electric potential VDD and a ground electric potential VSS supplied from the outside through the respective power supply terminals 43 and 44. Additionally, in place of generating the program electric potential VPPSV and the negative electric potential VBBSV by the power supply circuit 45, the program electric potential VPPSV and the negative electric potential VBBSV may be designed to be supplied from the outside. In this case, external terminals for use in the program electric potential VPPSV and the negative electric potential VBBSV are included.

Figure 2:
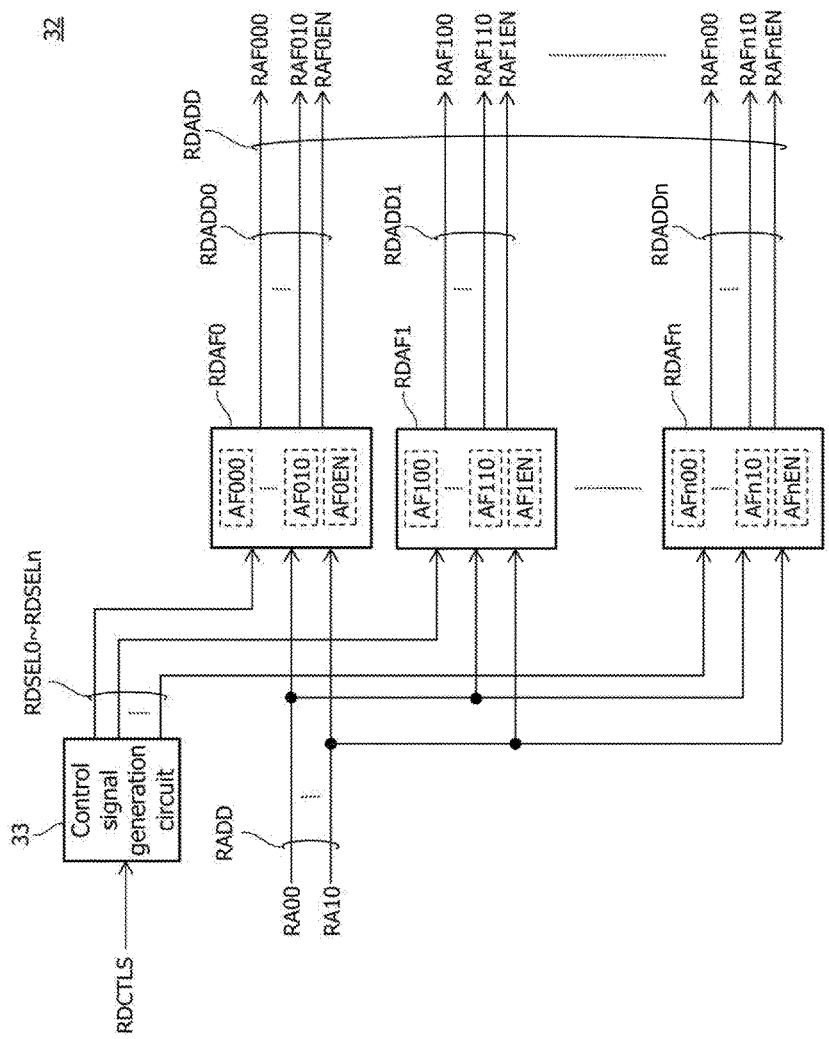
FIG. 2 is a circuit diagram showing a defective-address storage circuit according to an embodiment of the invention.

FIG. 2 is a circuit diagram of the defective address storage circuit 32 according to an embodiment of the invention.

As shown in FIG. 2, the defective address storage circuit 32 is provided with n+1 number of fuse set circuits RDAF0 to RDAFn that store address information of the respective defective word lines WL. The control signal generation circuit 33 controls the fuse set circuits RDAF0 to RDAFn. Based upon the fuse control signal RDCTLS, the control signal generation circuit 33 generates selection signals RDSEL0 to RDSELn that respectively select the fuse set circuits RDAF0 to RDAFn. The fuse set circuits RDAF0 to RDAFn are address holding circuits.

The fuse set circuits RDAF0 to RDAFn commonly receive bits RA00 to RA10 forming a row address RADD. In the present example, the row address RADD has a 11-bit configuration composed of bits RA00 to RA10; however, the present invention is not intended to be limited by this.

Each of the fuse set circuits RDAF0 to RDAFn includes twelve fuse circuits composed of eleven fuse circuits AFi00 to AFi10 (i=0 to n) respectively corresponding to the bits RA00 to RA10 of the row address RADD and an enable-use fuse circuit AFiEN (i=0 to n). For example, the fuse set circuit RDAF0 is composed of eleven fuse circuits AF000 to AF010 and an enable-use fuse circuit AF0EN. Each of the fuse circuits AFi00 to AFi10 and AFiEN can record a desired logical value. Thus, the defective address storage circuit 32 is allowed to store n+1 number of defective addresses.

The defective addresses RADD0 to RADDn respectively stored in the fuse set circuits RDAF0 to RDAFn correspond to defective addresses RDADD shown in FIG. 1, and form address signals. Each of the defective addresses RADD0 to RADDn has a 12-bit configuration composed of respective bits RAFi00 to RAFi10, and RAFiEN (i=0 to n).

Figure 3:
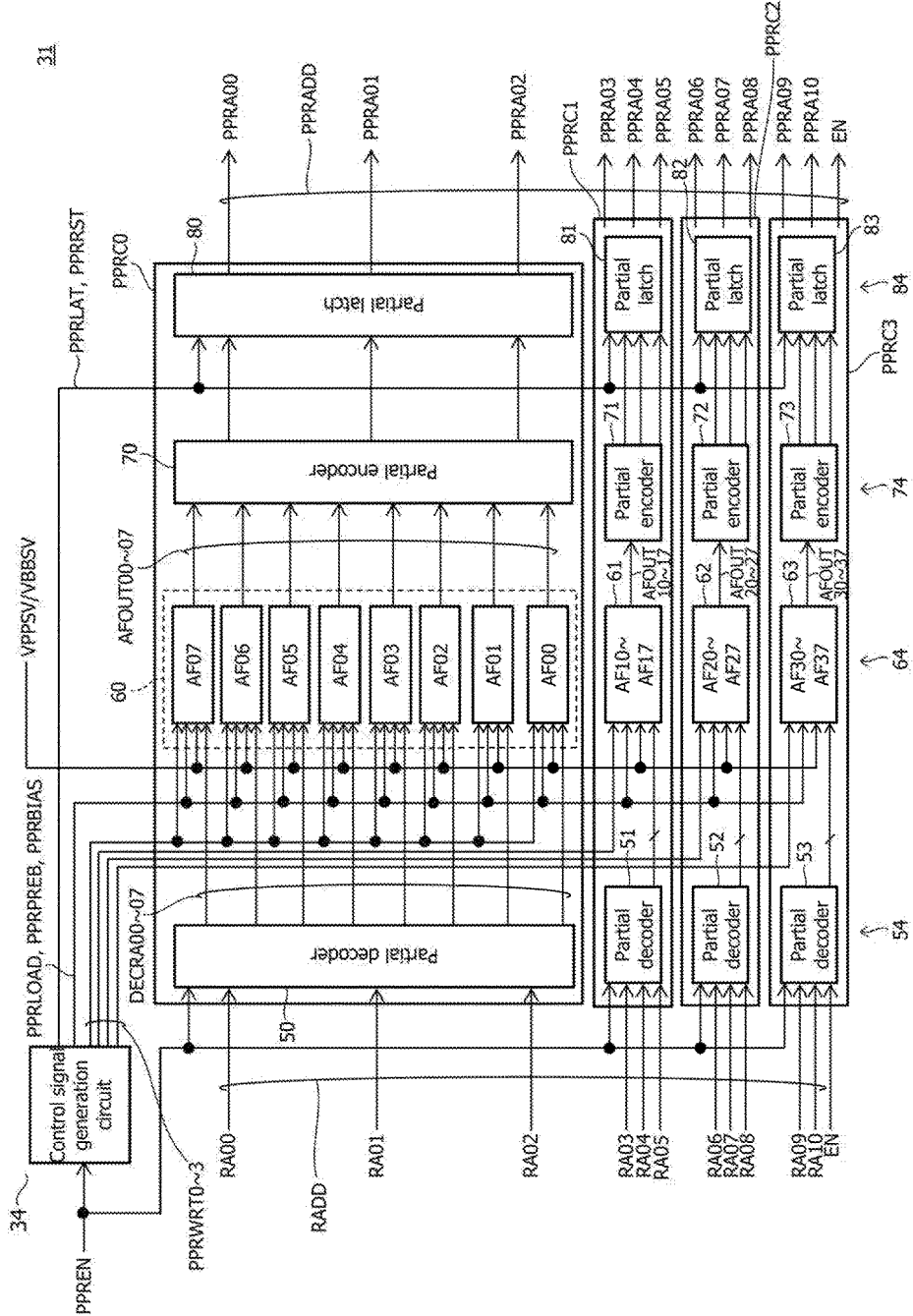
FIG. 3 is a circuit diagram showing the defective-address storage circuit according to an embodiment of the invention.

FIG. 3 is a circuit diagram of the defective address storage circuit 31 according to an embodiment of the invention.

As shown in FIG. 3, the defective address storage circuit 31 includes the control signal generation circuit 34 that is activated by the enable signal PPREN, a decoder circuit 54 composed of four partial decoders 50 to 53, an address holding circuit 64 composed of four blocks 60 to 63, an encoder circuit 74 composed of four partial encoders 70 to 73, and a latch circuit 84 composed of four partial latches 80 to 83. The control signal generation circuit 34 is a control circuit.

In this case, a circuit, which is composed of the partial decoder 50, the block 60, the partial encoder 70 and the partial latch 80, forms a processing circuit PPRC0 for use in processing 3 bits composed of the bits RA00 to RA02 of the row address RADD. Moreover, a circuit, which is composed of the partial decoder 51, the block 61, the partial encoder 71 and the partial latch 81, forms a processing circuit PPRC1 for use in processing 3 bits composed of the bits RA30 to RA05 of the row address RADD. Furthermore, a circuit, which is composed of the partial decoder 52, the block 62, the partial encoder 72 and the partial latch 82, forms a processing circuit PPRC2 for use in processing 3 bits composed of the bits RA06 to RA08 of the row address RADD. Then, a circuit, which is composed of the partial decoder 53, the block 63, the partial encoder 73 and the partial latch 83, forms a processing circuit PPRC3 for use in processing 3 bits composed of the bits RA9, RA10 and an enable bit EN of the row address RADD.

In this case, the row address RADD inputted to the defective address storage circuit 31 is an address signal indicating a word line WL having a defect, and corresponds to a signal in an encoded state.

Figure 4:
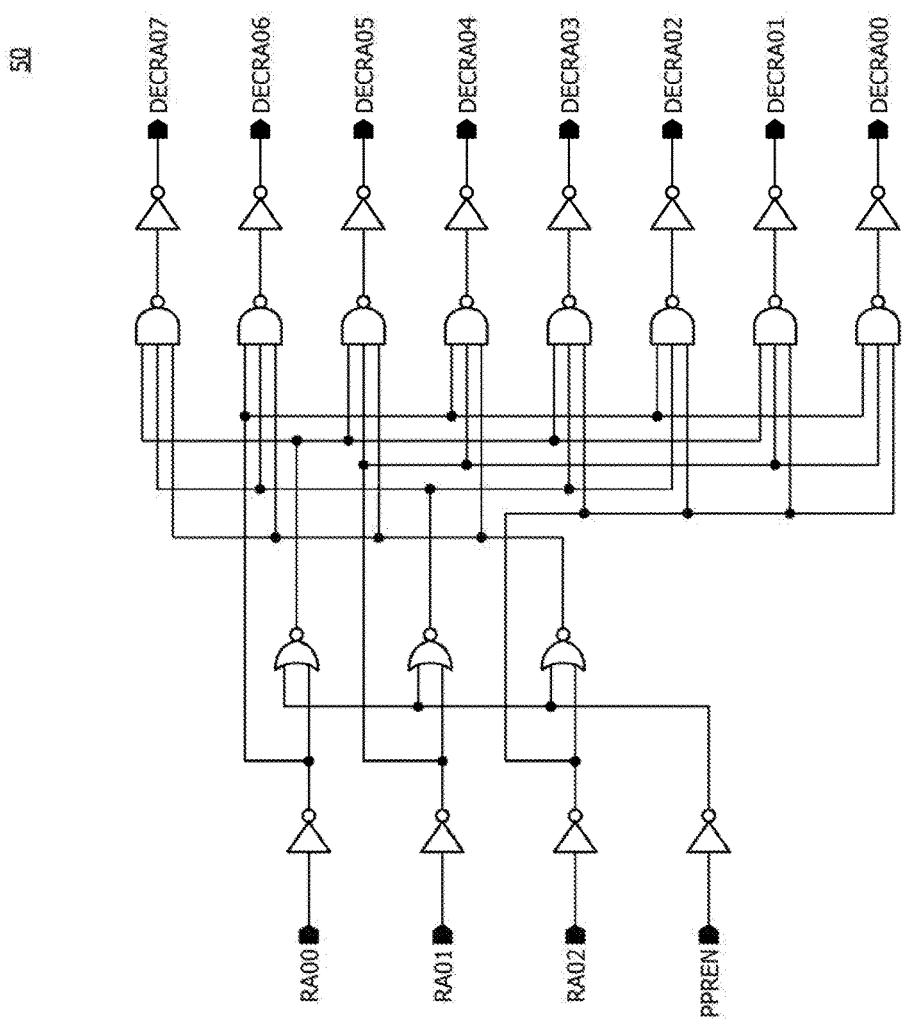
FIG. 4 is a circuit diagram showing a partial decoder according to an embodiment of the invention.

Any one of the partial decoders 50 to 53 is activated by the enable signal PPREN, and decodes each of the corresponding address portions of the row address RADD. The partial decoder 50 whose circuit diagram is shown in FIG. 4 decodes an address portion of 3 bits composed of bits RA00 to RA02 contained in the row address RADD, and thus generates decode address signals of 8 bits DECRA00 to DECRA07 that are the result of decoding. Therefore, of the decoded address signals of 8 bits DECRA00 to DECRA07, only one bit becomes an active level (high level), and the remaining 7 bits are always set to an non-active level (low level). However, in the case when the enable signal PPREN is made non-active to the low level, all the decode address signals of 8 bits DECRA00 to DECRA07 are set to the non-active level (low level).

In the same manner, the partial decoder 51 decodes an address portion of 3 bits composed of bits RA03 to RA05 of the row address RADD, and thus generates decode address signals of 8 bits DECRA10 to DECRA17 that are the results of decoding. Moreover, the partial decoder 52 decodes an address portion of 3 bits composed of bits RA06 to RA08 of the row address RADD, and thus generates decode address signals of 8 bits DECRA20 to DECRA27 that are the result of decoding. Furthermore, the partial decoder 53 decodes an address portion of 2 bits composed of bits RA09 to RA10 of the row address RADD and the enable bit EN, and thus generates decode address signals of 8 bits DECRA30 to DECRA37 that are the results of decoding.

The decode address signals outputted from the partial decoders 50 to 53 are respectively supplied to the corresponding blocks 60 to 63. As shown in FIG. 3, each of the blocks 60 to 63 includes eight fuse circuits to which corresponding bits of the decode address signals are supplied.

For example, the decode address signals DECRA00 to DECRA07 outputted from the partial decoder 50 are respectively supplied to the fuse circuits AF00 to AF07 forming the block 60. Moreover, the decode address signals DECRA10 to DECRA17 outputted from the partial decoder 51 are respectively supplied to the fuse circuits AF10 to AF17 forming the block 61. Furthermore, the decode address signals DECRA20 to DECRA27 outputted from the partial decoder 52 are respectively supplied to the fuse circuits AF20 to AF27 forming the block 62. Then, the decode address signals DECRA30 to DECRA37 outputted from the partial decoder 53 are respectively supplied to the fuse circuits AF30 to AF37 forming the block 63.

These blocks 60 to 63 are selectively activated by block selection signals PPRWRT0 to PPRWRT3 generated by the control signal generation circuit 34. As will be described later, the block selection signals PPRWRT0 to PPRWRT3 are signals that are successively activated at the time of programming. Moreover, a program electric potential VPPSV and a negative electric potential VBBSV are supplied to the fuse circuits contained in the respective blocks 60 to 63, and their operations are controlled by a load signal PPRLOAD, a pre-charge signal PPRPREB and a bias signal PPRBIAS generated by the control signal generation circuit 34.

Output signals AFOUT of the respective blocks 60 to 63 are respectively supplied to the corresponding partial encoders 70 to 73. The output signal AFOUT is an address signal that indicates a word line WL having a defect in a partially decoded state. The partial encoders 70 to 73 recover an address portion corresponding to the defective address PPRADD by encoding the respective output signals AFOUT of the blocks 60 to 63.

For example, the output signals AFOUT10 to AFOUT07 of 8 bits released from the block 60 are encoded by the partial encoder 70 so that an address portion of 3 bits composed of bits PPRA00 to PPRA02 of defective address PPRADD is generated. Therefore, any one of the respective bits PPRA00 to PPRA02 forming the corresponding address portion is allowed to take a desirable logical level, and its value is coincident with the bits RA00 to RA02 of the defective address RADD.

Moreover, the output signals AFOUT10 to AFOUT17 of 8 bits released from the block 61 are encoded by the partial encoder 71 so that an address portion of 3 bits composed of bits PPRA03 to PPRA05 of defective address PPRADD is generated. Furthermore, the output signals AFOUT20 to AFOUT27 of 8 bits released from the block 62 are encoded by the partial encoder 72 so that an address portion of 3 bits composed of bits PPRA06 to PPRA08 of defective address PPRADD is generated. Then, the output signals AFOUT30 to AFOUT37 of 8 bits released from the block 63 are encoded by the partial encoder 73 so that an address portion of 2 bits composed of bits PPRA09 and PPRA10 of defective address PPRADD and an enable bit EN are generated.

Then, the address portions of defective address PPRADD outputted from the partial encoders 70 to 73 are respectively latched by the corresponding partial latches 80 to 83 in response to latch signals. The defective addresses PPRA00 to PPRA10 and EN latched by the partial latches 80 to 83 are supplied to the row control circuit 12 shown in FIG. 1.

Figure 5:
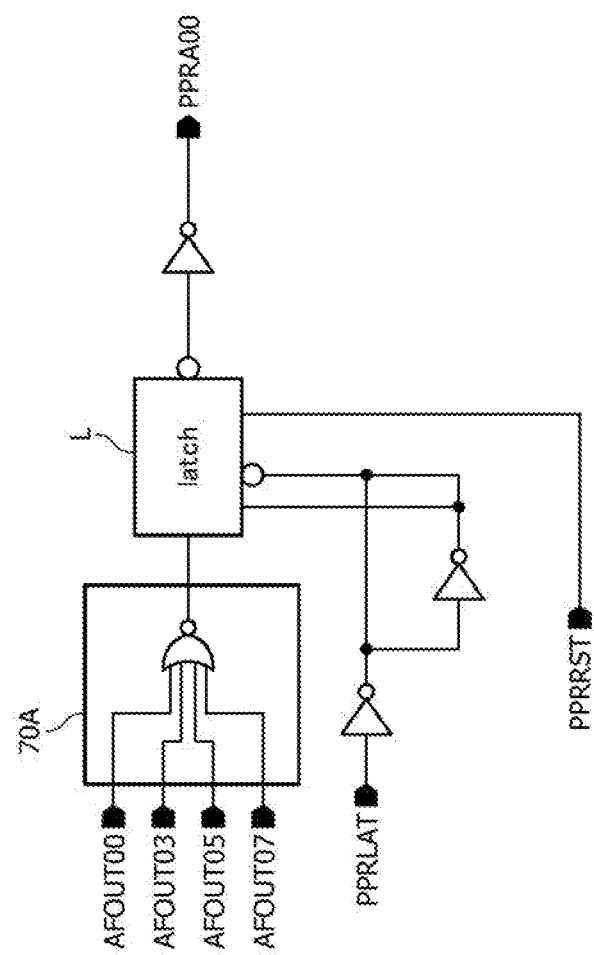
FIG. 5 shows a logic circuit included in the partial encoder and a latch circuit diagram corresponding thereto according to an embodiment of the invention.

FIG. 5 is a circuit diagram showing a logical circuit 70A included in the partial encoder 70 and a latch L corresponding thereto according to an embodiment of the invention.

FIG. 5 shows the logical circuit 70A for generating a bit PPRA00 of the defective address PPRADD of the logical circuits included in the partial encoder 70. The logical circuit for generating the bit PPRA00 of the defective address PPRADD includes a NOR gate circuit that receives 4 bits composed of output signals AFOUT00, 03, 05, 07 of the block 60, and in the case when all the 4 bits are in the low level, the NOR gate sets the bit PPRA00 to the high level.

The bit PPRA00 outputted from the NOR gate circuit is further outputted through a latch L included in the partial latch 80. As shown in FIG. 5, the latch L captures the bit PPRA00 in response to the rising edge of a latch signal PPRLAT. Moreover, the bit PPRA00 captured by the latch L is reset by a reset signal PPRRST.

Figure 6:
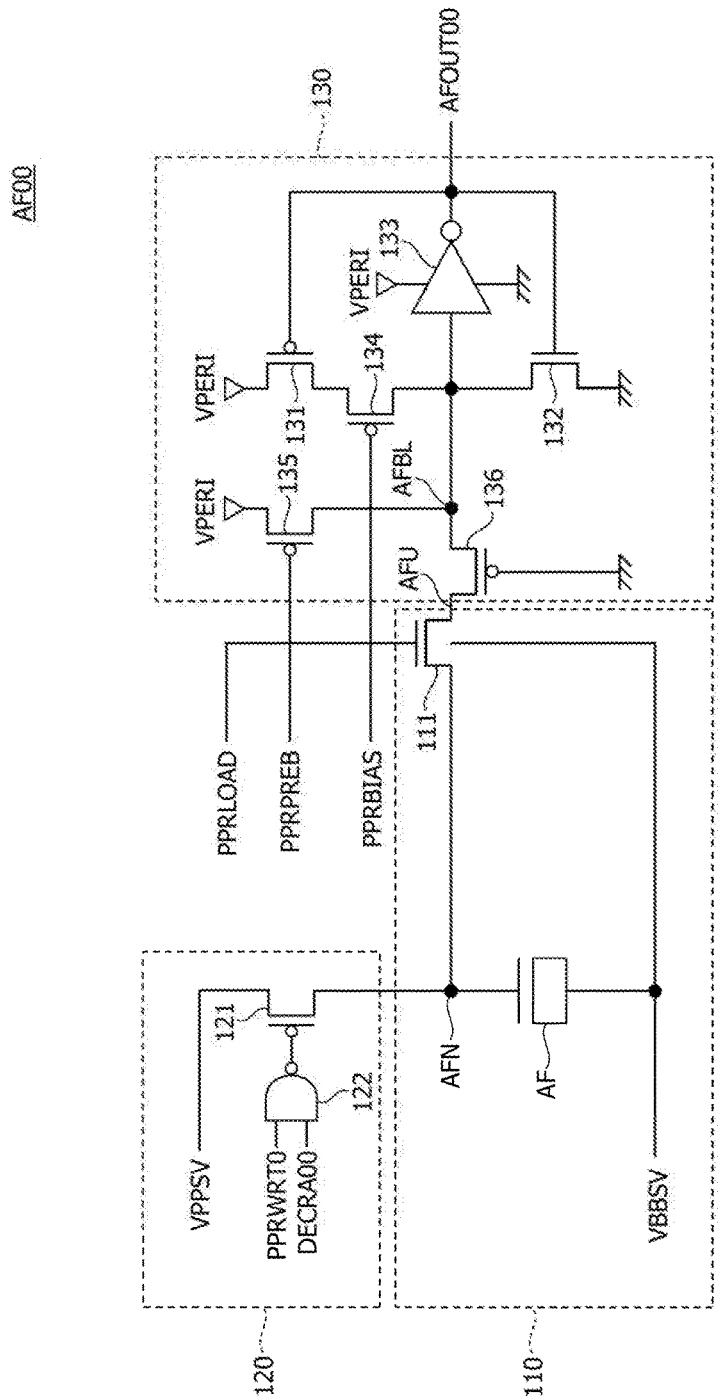
FIG. 6 is a circuit diagram showing a fuse circuit according to an embodiment of the invention.

FIG. 6 is a circuit diagram showing the fuse circuit AF00.

As shown in FIG. 6, the fuse circuit AF00 includes a load circuit 110, a connector circuit 120 and a sense circuit 130.

The load circuit 110 includes an anti-fuse element AF connected between a connection node AFN and a power supply wire to which the negative electric potential VBBSV is supplied, and an N-channel-type MOS transistor 111 coupled between a connection node AFN and a connection node AFU. The anti-fuse element AF is insulated in its initial state, and when a high voltage is applied between the two terminals by a connecting operation, it is subjected to dielectric breakdown to be made conductive.

The transistor 111 forms a switch for controlling connection between the anti-fuse element AF and the connection node AFU, and a load signal PPRLOAD is supplied to its gate electrode. Moreover, the substrate of the transistor 111 is connected to a power supply wiring to which a negative electric potential VBBSV is supplied.

The load signal PPRLOAD is a signal for causing activation to a high level at the time of a load operation. At the time of the load operation, the connection node AFU is connected to a power supply wiring to which the program electric potential VBBSV is supplied through the anti-fuse element AF. The connection node AFU is connected to a sense node AFBL inside the sense circuit 130 through a P-channel-type MOS transistor 136. Since the gate electrode of the transistor 136 is secured to the ground electric potential VSS, the sense node AFBL is not set to the negative electric potential even when the connection node AFU is set to the negative electric potential.

The connector circuit 120 includes a P-channel-type MOS transistor 121 connected between a power supply wiring to which the program electric potential VPPSV is supplied and the connection node AFN. An output signal of the NAND gate circuit 122 that receives a block selection signal PPRWRT0 and a decode address signal DECRA00 is supplied to the gate electrode of the transistor 121. Thus, when both of the block selection signal PPRWRT0 and the decode address signal DECRA00 are activated to the high level, the transistor 121 is turned on so that a high voltage is applied between the two ends of the anti-fuse AF. When the high voltage is applied between the two ends of the anti-fuse element AF, the anti-fuse element changes to a conductive state by dielectric breakdown.

The sense circuit 130 forms a latch circuit in which an inverter circuit composed of a P-channel-type MOS transistor 131 and an N-channel-type MOS transistor 132, and an inverter circuit 133 are coupled together. Moreover, the input node of the inverter circuit 133 is connected to the sense node AFBL. In this case, an internal electric potential VPERI is supplied to the source of the transistor 131, and a ground electric potential VSS is supplied to the source of the transistor 132. The internal electric potential VPERI is, for example, 1.0V. With respect to the operation power supply of the inverter circuit 133, a voltage (1.0V) between the internal electric potential VPERI and the ground electric potential VSS is used.

Moreover, a P-channel-type bias transistor 134 is connected between the transistor 131 and the sense node AFBL. A bias electric potential BIAS is supplied to the gate electrode of the bias transistor 134, and consequently, the magnitude of a sense current flowing through the sense node AFBL is controlled in response to the bias electric potential BIAS. However, the bias transistor 134 is not required and may be optionally included in some embodiments.

Furthermore, a P-channel-type pre-charge transistor 135 is connected between the power supply wiring to which the internal electric potential VPERI is supplied and the sense node AFBL. A pre-charge signal PPRPREB is supplied to the gate electrode of the pre-charge transistor 135. Thus, when the pre-charge signal PPRPREB is activated to the low level, the sense node AFBL is pre-charged to VPERI level (1.0V).

The foregoing description has been provided to explain the circuit configuration of the fuse circuit AF00. Moreover, another fuse circuit included in each of the blocks 60 to 63 has the same circuit configuration as that of the fuse circuit AF00 shown in FIG. 6, except that the combinations of signals to be inputted to the connection circuit 120 are different. Moreover, with respect to the fuse circuit included in the defective address storage circuit 32, the same circuit configuration as that of the fuse circuit AF00 shown in FIG. 6 is used except that the combinations of signals to be inputted to the connection circuit 120 are different.

Next, the following description will discuss the operation of the defective address storage circuit 31 according to an embodiment of the invention.

Figure 7:
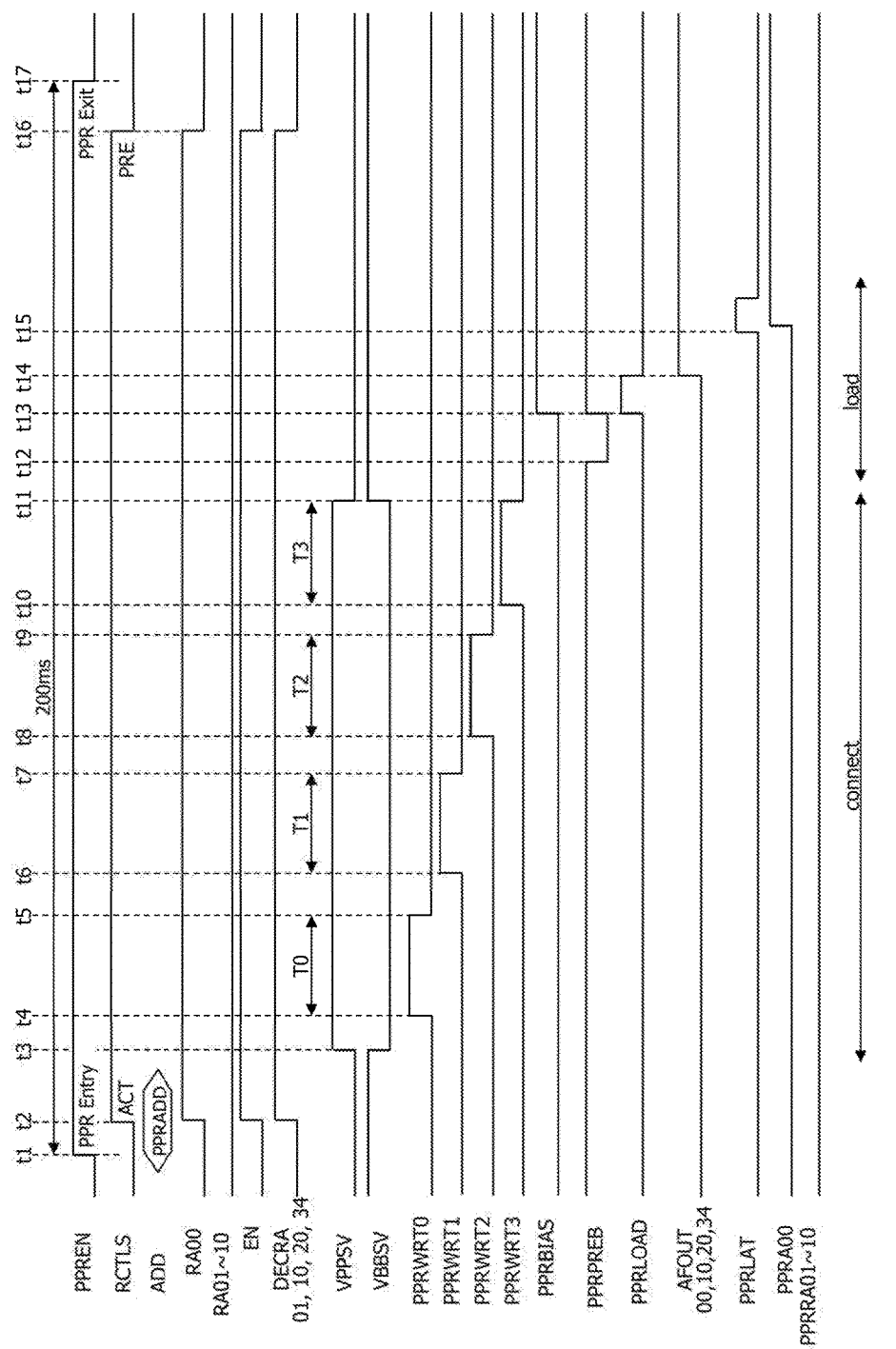
FIG. 7 is a timing chart for use in explaining operations of the defective address storage circuit according to an embodiment of the invention.

FIG. 7 is a timing chart for use in explaining the operation of the defective address storage circuit 31.

In the example of FIG. 7, a mode register set command is issued at time t1, and a PPR enable is set to a mode register 24. This operation is a PPR entry operation, and the enable signal PPREN is thus activated to the high level. During a period of the high level of the enable signal PPREN, a programming process is carried out on the defective address storage circuit 31. In the present example, the mode register set command is again issued at time t17 so that the enable signal PPREN is non-activated to the low level. The period of the high level of the enable signal PPREN is, for example, 200 ms, and the upper limit thereof is determined by a specification.

After the enable signal PPREN has been activated to the high level at time t1, an active command ACT and a defective address PPRADD are externally inputted at time t2. When the active command ACT is issued, the command decoder 21 shown in FIG. 1 activates the row control signal RCTLS. In response to this, the enable bit EN becomes the high level.

Moreover, of the bits RA00 to RA10 forming the defective address PPRADD, the example of FIG. 7 illustrates a state in which the bit RA00 is in the high level, with the other bits RA01 to RA10 set in the low level. The defective address PPRADD is inputted to the corresponding partial decoders 50 to 53, and in accordance with the value thereof, a decode address signal DECRA is generated.

In the present example, since the bit RA00 is in the high level with the bits RA01 to RA10 in the low level, the partial decoder 50 sets a decode address signal DECRA01 to the high level, the partial decoder 51 sets a decode address signal DECRA10 to the high level, the partial decoder 52 sets a decode address signal DECRA20 to the high level, and the partial decoder 53 sets a decode address signal DECRA34 to the high level. All the other decode address signals are set to the low level.

Thereafter, a program electric potential VPPSV and a negative electric potential VBBSV are generated at time t3 by the activation of a pumping circuit, not shown, that is included in the power supply circuit 45. In this state, the block selection signals PPRWRT0 to PPRWRT3 are successively activated by the control of the control signal generation circuit 34. More specifically, during a period of T0 from times t4 to time t5, the block selection signal PPRWRT0 is activated to the high level, during a period of T1 from time t6 to time t7, the block selection signal PPRWRT1 is activated to the high level, during a period of T2 from time t8 to time t9, the block selection signal PPRWRT2 is activated to the high level, and during a period of T3 from time t10 to time t11, the block selection signal PPRWRT3 is activated to the high level.

During the period T0 of the high level of the block selection signal PPRWRT0, the block 60 is selected. Then, with respect to the decode address signals DECRA00 to DECRA07 supplied from the partial decoder 50 to the block 60, a connecting operation is carried out on the anti-fuse element AF included in the fuse circuit AF01 since only the decode address signal DECRA01 is in the high level, as described earlier. No connecting operation is carried out on the other fuse circuits AF00 and AF02 to AF07.

During the period T3 of the high level of the block selection signal PPRWRT1, the block 61 is selected. Then, with respect to the decode address signals DECRA10 to DECRA17 supplied from the partial decoder 51 to the block 61, a connecting operation is carried out on the anti-fuse element AF included in the fuse circuit AF10 since only the decode address signal DECRA10 is in the high level, as described earlier. No connecting operation is carried out on the other fuse circuits AF11 to AF17.

During the period T2 of the high level of the block selection signal PPRWRT2, the block 62 is selected. Then, with respect to the decode address signals DECRA20 to DECRA27 supplied from the partial decoder 52 to the block 62, a connecting operation is carried out on the anti-fuse element AF included in the fuse circuit AF20 since only the decode address signal DECKRA20 is in the high level, as described earlier. No connecting operation is carried out on the other fuse circuits AF21 to AF27.

During the period T3 of the high level of the block selection signal PPRWRT3, the block 63 is selected. Then, with respect to the decode address signals DECRA30 to DECRA37 supplied from the partial decoder 53 to the block 63, a connecting operation is carried out on the anti-fuse element AF included in the fuse circuit AF34 since only the decode address signal DECRA34 is in the high level, as described earlier. No connecting operation is carried out on the other fuse circuits AF30 to AF33 as well as AF35 to AF37.

In this manner, during periods from T0 to T3, the connecting operation is carried out on the individual one of fuse circuits included in the blocks 60 to 63. Therefore, the programming process is completed by the connecting operations of four times. This means that irrespective of the values of the bits RA00 to RA10 forming the defective address PPRADD, the programming process is always completed by carrying out the connecting operations on the four fuse circuits.

Next, at time t12, the pre-charge signal PPRPREB is activated to the low level. Thus, the sense node AFBL is pre-charged to the VPREI level since the pre-charge transistor 135 shown in FIG. 6 is turned on. Then, the pre-charge is released at time t13 with the bias signal PPRBIAS set to a predetermined bias level, and the load signal PPRLOAD is activated to the high level. Thus, the sense node AFBL pre-charged to the VPREI level is discharged through the anti-fuse element AF.

At this time, the discharge quantity ref the sense node AFBL is changed depending on a state of the anti-fuse element AF. More specifically, in the case when the anti-fuse element AF is in a high resistance state, that is, in an unconnected state, the sense node AFBL maintains the pre-charge level since the sense node AFBL is hardly discharged. In this case, the output signal AFOUT of the corresponding fuse circuit becomes the low level.

In contrast, in the case when the anti-fuse element AF is in a low resistance state, that is, in a connected state, the electric potential of the sense node AFBL is lowered to less than the logical threshold value of the inverter circuit 133 since the sense node AFBL is discharged through the anti-fuse element AF. In this case, the output signal AFOUT of the corresponding fuse circuit is set to the high level.

Additionally, in the present embodiment, since the transistor 136 functioning as a rectifier circuit is included in the sense circuit 130, the electric potential of the sense node AFBL is not lowered down to the negative electric potential, even when the anti-fuse element AF is in the connected state.

Moreover, at time t14, the load signal PPRLOAD becomes the low level so that the level of the output signal AFOUT is determined. In the present example, the output signal AFOUT01 outputted from the block 60, the output signal AFOUT10 outputted from the block 61, the output signal AFOUT20 outputted from the block 62 and the output signal AF0UT34 outputted from the block 63 respectively become the high level. All the other output signals AFOUT are in the low level.

These output signals AFOUT are respectively inputted to the corresponding partial encoders 70 to 73 and respectively restored to address portions of 3 bits. In other words, the value of the defective address PPRADD obtained by the encoding process is the same as the value of the defective address PPRADD before the decoding process.

The defective address PPRADD restored in this manner is latched by partial latches 80 to 83 in response to the latch signal PPRLAT activated at time t15, and supplied to the row control circuit 12 shown in FIG. 1. Of the bits PPRA00 to PPRRA10 forming the defective address PPRADD, the bit PPRRA00 is in the high level, with the other bits PPRRA01 to PPRRA10 in the low level.

Thereafter, when a pre-charge command PRE is issued at time t16,the row control signal RCTLS returns to the low level, and the value of the defective address PPRADD externally inputted is reset. Moreover, at time t17, a mode register set command is issued so that the PPR enable set by the mode register 24 is released. This operation refers to a PPR exit operation, and this operation thus returns the enable signal PPREN to the low level.

In this manner, in the present embodiment, the writing operation of the defective address PPRADD of 11 bits is carried out on the defective address storage circuit 31 successively bit by bit; however, the connecting operations are always finished not by connecting operations of 11 times, but by the connecting operations of 4 times. For this reason, even in the case when the period of time permitted for the sequence of programming processes is limited to, for example, 200 ms, it becomes possible to finish the programming processes within the corresponding period.

Additionally, the operations from time t12 to time t15 shown in FIG. 7 are operations required for reading out the defective address PPRADD from the defective address storage circuit 31, which is also executed at the time power is applied to the semiconductor device 10. Thus, the defective address PPRADD programmed in the defective address storage circuit 31 is always supplied to the row control circuit 12 after the application of power. This aspect is the same as in the defective address storage circuit 32, and the defective address RDADD programmed in the defective address storage circuit 32 is supplied to the row control circuit 12 after the application of power.

Figure 8:
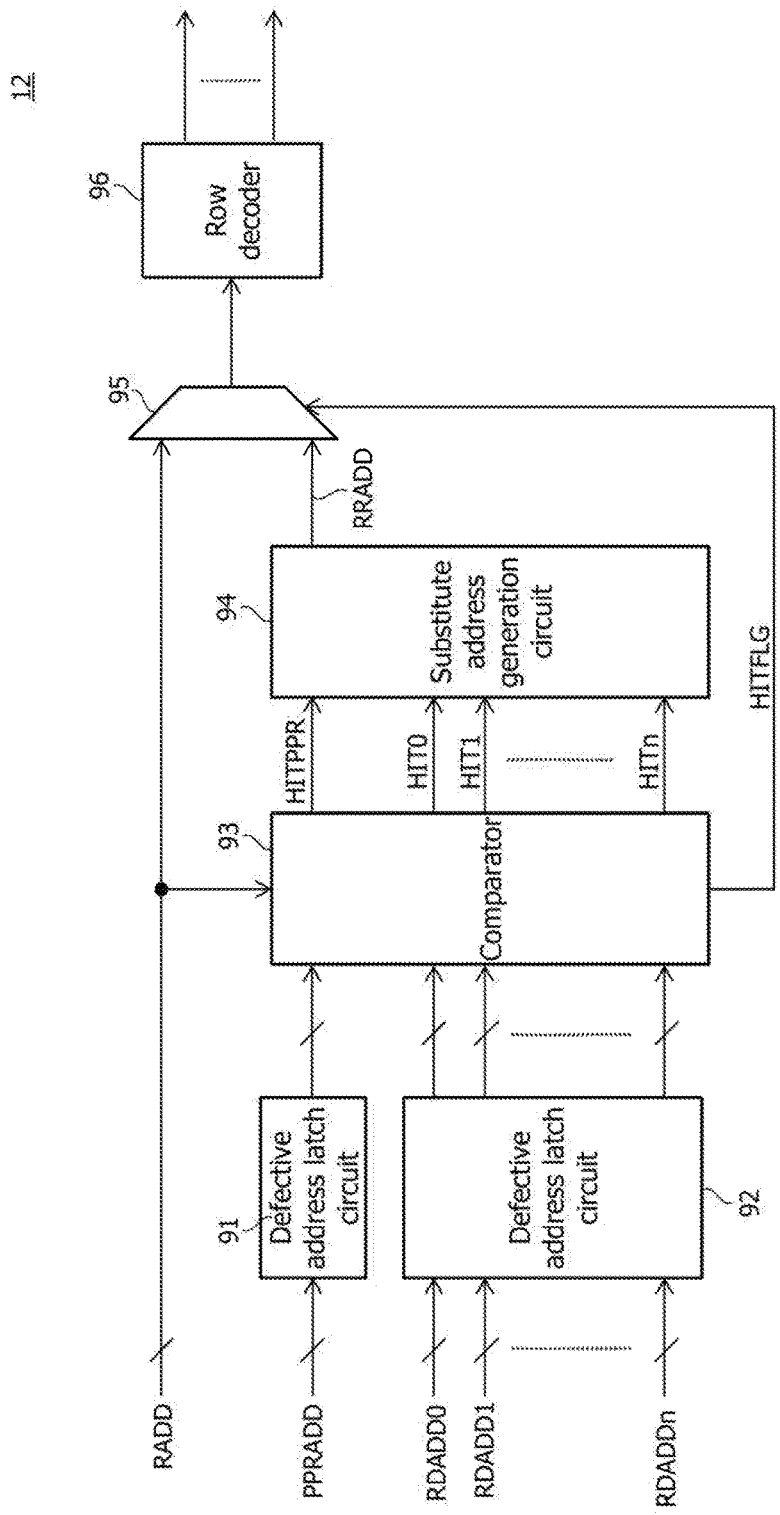
FIG. 8 is a block diagram showing a configuration of a row control circuit according to an embodiment of the invention.

FIG. 8 is a block diagram showing a configuration of the row control circuit 12 according to an embodiment of the invention.

As shown in FIG. 8, the row control circuit 12 includes defective address latch circuits 91 and 92. The defective address latch circuit 91 is a circuit for use in latching a defective address PPRADD read out from the defective address storage circuit 31. The defective address latch circuit 92 is a circuit for use in latching a defective address PDADD read out from the defective address storage circuit 32. The defective addresses PPRADD and RDADD latched by the defective address latch circuits 91 and 92 are supplied to a comparator 93 included in the row control circuit 12.

The comparator 93 is a circuit for comparing the row address RADD whose access is demanded with the defective addresses PPRADD and RDADD latched by the defective address latch circuits 91 and 92. The result of the comparison by the comparator 93 is outputted as a comparison result signal. The row address whose access is demanded corresponds to an address signal.

Figure 9:
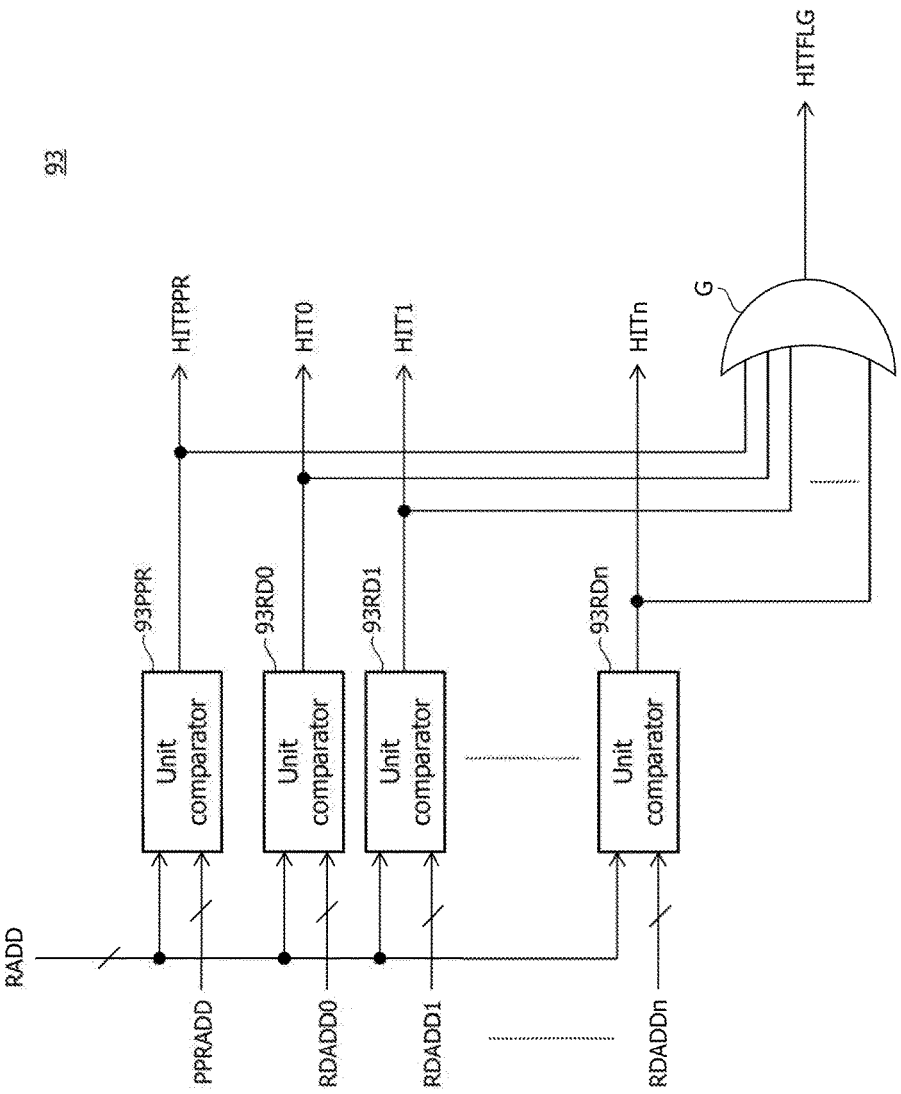
FIG. 9 is a circuit diagram showing a comparator according to an embodiment of the invention.

FIG. 9 is a circuit diagram of the comparator 93 according to an embodiment of the invention.

As shown in FIG. 9, the comparator 93 includes a plurality of unit comparators 93PPR, and 93RD0 to 93RDn.

The unit comparator 93PPR is a circuit for comparing the defective address PPRADD latched by the defective address latch circuit 91 with the row address RADD whose access is demanded, and when all the bits of the two addresses are coincident with each other, a hit signal HITPPR is activated. Thus, when an access is demanded to a row address RADD having the same value as that of the defective address PPRADD, the hit signal HITPPR is activated. However, in the case when the enable bit EN is in the low level, the unit comparator 93PPR is non-activated so that no comparison operation is carried out.

The unit comparators 93RD0 to 93RDn are circuits for respectively comparing defective addresses RDADD0 to RDADDn latched by the defective address latch circuit 92 with the row address RADD whose access is demanded. When all the bits of the two addresses are the same, the corresponding hit signals HIT0 to HITn are activated. Thus, when an access is demanded to a row address RADD that has the same value as that of any one of the defective addresses RDADD0 to RDADDn, the corresponding hit signal HIT0 to HITn is activated. However, in the case when the corresponding enable bit RAF0EN to RAFnEN is in the low level, the corresponding unit comparator 93RD0 to 93RDn is non-activated so that no comparison operation is carried out.

Moreover, the hit signals HITPPR, HIT0 to HITn are inputted to an OR gate circuit G. When any one of the hit signals HITPPR, HIT0 to HITn is activated to the high level, the OR gate circuit G activates a hit flag HITFLG serving as a comparison result signal to be set to the high level.

The hit signals HITPPR, HIT0 to HITn thus generated are supplied to a substitute address generation circuit 94 shown in FIG. 8. Moreover, the hit flag HITFLG is supplied to an address selector 95 shown in FIG. 8.

The substitute address generation circuit 94 stores row addresses RRADD corresponding to the respective hit signals HITPPR, HIT0 to HITn, and when any one of the hit signals HITPPR, HIT0 to HITn is activated, the corresponding row address RRADD is outputted. The row address RRADD is supplied to the address selector 95.

Based upon the hit flag HITFLG, the address selector 95 selects either one of the row address RADD whose access is demanded and the row address RRADD supplied from the substitute address generation circuit 94. More specifically, in the case when the hit flag HITFLG is in the non-active state, the address selector 95 selects the row address RADD whose access is demanded, and supplies this address to the row decoder 96 serving as the control circuit. Thus, the word line WL corresponding to the row address RADD whose access is demanded is activated.

In contrast, in the case when the hit flag HITFLG is in the active state, the address selector 95 selects the row address RRADD supplied from the substitute address generation circuit 94, and supplies this address to the row decoder 96. Thus, in place of the defective word line WL, a redundant word line RWL is activated so that the row address corresponding to the defective word line WL is saved.

In this manner, a defective word line WL occurred after the packaging process can be substituted by a redundant word line RWL on the user side since the semiconductor device 10 in accordance with the present embodiment includes the defective address storage circuit 31 that can be programmed on the user side. Moreover, the number of the anti-fuse elements AF on which the connecting operations have to be carried out is made smaller since the defective address storage circuit 31 divides the row address PPRADD to be programmed into a plurality of address portions, with each address portion written in the anti-fuse element AF in a decoded state. Thus, the period of time required for the sequence of programing processes to be carried out on the defective address storage circuit 31 is shortened.

Additionally, the foregoing embodiment has given an explanation by exemplifying a configuration in which anti-fuse elements are used as fuse elements; however, the kind of the fuse elements to be used is not intended to be particularly limited, and any kind of fuse elements may be used as long as they are nonvolatile storage elements on which the writing process is carried out electrically. Moreover, even in the case of using the anti-fuse element as the fuse element, its circuit configuration is not intended to be limited by the circuit configuration shown in FIG. 6.

Moreover, in the above-mentioned embodiment, supposing that the number of bits of an address portion before the decoding is M, the number of fuse elements included in each block is represented by $2^M$ pieces; however, this may be set to $2^M-1$ pieces. In this case, if the address portion before the decoding is a predetermined value (for example, all 0), all the fuse elements may be set to an unprogrammed state.

Furthermore, in the above-mentioned embodiment, the row address RADD and the enable bit EN are divided into address portions of 3 bits and decoded; however, the number of bits forming each address portion is not intended to be particularly limited as long as the number is 2 bits or more.

Furthermore, in the above-mentioned embodiment, the defective word line WL is substituted by allowing the defective address storage circuits 31 and 32 to hold row addresses; however, a defective bit line BL may be substituted by allowing them to hold column addresses instead of the row addresses. In this case, various selection lines other than the word line WL and the bit line BL may be substituted.

In this manner, a plurality of input nodes is configured to be supplied with input signals RA00 to RA02. A partial decoder 50 is coupled to the input nodes. The partial decoder 50 is configured to decode the input signals RA00 to RA02 and output decoded signals. A plurality of fuse circuits AF00 to AF07 is provided correspondingly to the decoded signals and configured to be programmed responsive to the decoded signals, respectively. A plurality of latch circuits of the address latch circuit 22 has output nodes coupled to the plurality of input nodes, respectively.

The semiconductor device 10 comprises a plurality of bit lines, a plurality of word lines and a plurality of memory cells arranged at intersections of the bit lines and the word lines, respectively. The fuse circuits AF00 to AF07 are configured to store programmed information that indicates address information of at least a part of one of the plurality of memory cells. The one of the plurality of memory cells is defective.

The number of the input nodes is equal to M (M is an integer of two or more) to receive M number of the input signals RA00 to RA02. The partial decoder 50 is configured to output $2^M$ number of the output signals. The number of the fuse circuits AF00 to AF07 is equal to $2^M$. The partial decoder 50 is configured to activate one of the decoded signals and inactivate the others of the decoded signals.

On the other hand, the number of the input nodes is equal to M to receive M number of the input signals RA00 to RAO2. The partial decoder 50 is configured to output $(2^M-1)$ number of the output signals. The number of the fuse circuits is equal to $2^M-1$. The partial decoder 50 is configured to inactivate all of the decoded signals when the input signals RA00 to RA02 take a first pattern and the partial decoder 50 is configured to activate one of the decoded signals when the input signals RA00 to RA02 take a second pattern different from the first pattern.

The semiconductor device 10 comprises a plurality of input terminals and a plurality of fuse circuits AF00 to AF07. The plurality of fuse circuits AF00 to AF07 is configured to be programmed based on input signals RA00 to RA02 respectively supplied to the input terminals. The number of the plurality of fuse circuits AF00 to AF07 is equal to or more than $(2^M-1)$. M is equal to the number of the plurality of input terminals. The semiconductor device 10 further comprises a partial encoder 70 configured to encode output signals of the fuse circuits AF00 to AF07 to produce M number of encoded signals. The semiconductor device 10 further comprises a memory cell array 11 including a plurality of memory cells and an address control circuit (a row control circuit 12 and a column control circuit 13) coupled to the memory cell array 11. The address control circuit is configured to receive the M number of encoded signals, receive an address signals and compare the M number of encoded signals with at least a part of the address signals to determine whether or not at least one of the memory cells corresponding to the address signals is displaced to at least one of other memory cells. Each of the fuse circuits AF00 to AF07 is configured to be programmed by a voltage applied therebetween.

The number of the plurality of fuse circuits AF00 to AF07 is equal to $2^M$ and only one of the fuse circuits AF00 to AF07 is programmed regardless of patterns of the input signals RA00 to RA02.

On the other hand, the number of the plurality of fuse circuits is equal to $(2^M-1)$ and none of the fuse circuits is programmed responsive to a specified pattern of the input signals RA00 to RA02.

The semiconductor device 10 comprises a plurality of first input terminals, a plurality of second input terminals, a plurality of first fuse circuits AF00 to AF07 and a plurality of second fuse circuits AF10 to AF17. A plurality of first fuse circuits AF00 to AF07 is configured to be programmed based on first input signals RA00 to RA02 respectively supplied to the first input terminals. The number of the plurality of first fuse circuits AF00 to AF07 is equal to or more than $(2^M-1)$. M is equal to number of the plurality of first input terminals. A plurality of second fuse circuits AF10 to AF17 is configured to be programmed based on second input signals RA03 to RA05 respectively supplied to the second input terminals. The number of the plurality of second fuse circuits AF10 to AF17 is equal to or more than $(2^N-1)$. N is equal to the number of the plurality of second input terminals.

The semiconductor device 10 further comprises a first partial encoder 70 configured to encode first output signals of the first fuse circuits AF00 to AF07 to produce M number of first encoded signals and a second partial encoder 71 configured to encode second output signals of the second fuse circuits AF10 to AF17 to produce N number of second encoded signals.

The semiconductor device 10 further comprises a memory cell array 11 including a plurality of memory cells and an address control circuit (a row control circuit 12 and a column control circuit 13) coupled to the memory cell arrayal. The address control circuit is configured to receive the M number of first encoded signals and the N number of second encoded signals, receive an address signals and compare combination signals of the M number of first encoded signals and the N number of second encoded signals with at least a part of the address signals to determine whether or not at least one of the memory cells corresponding to the address signals is displaced to at least one of other memory cells.

M and N are equal to each other.

On the other hand, M and N are different from each other.

It is apparent that the present invention is not limited to the above embodiments, but may be modified and changed without departing from the scope and spirit of the invention.

What is claimed is:

1. A method comprising:
   decoding a plurality of address bits to produce a plurality of decoded address bits; and
   programming the plurality of decoded address bits into a plurality of fuse circuits.

2. The method of claim 1, wherein a number of the plurality of address bits is equal to M and a number of the plurality of decoded address bits is equal to N; and
   wherein each of M and N is an integer of two or more and N is greater than M.

3. The method of claim 1, further comprising:
   generating a first voltage before programming the plurality of decoded address bits, and programming the plurality of decoded address bits is executed by using the first voltage.

4. The method of claim 3, further comprising:
generating a second voltage different from the first voltage before programming the plurality of decoded address bits, and programming the plurality of decoded address bits is executed by using the second voltage.

5. The method of claim 4, wherein generating the first, voltage and generating the second voltage is executed substantially at the same time.

6. The method of claim 1, further comprising:
encoding the plurality of decoded address bits programmed into the plurality of fuse circuits to reproduce the plurality of address bits; and
latching the plurality of address bits that have been reproduced by encoding.

7. The method of claim 6, further comprising:
setting a first command to enter a PPR mode before decoding the plurality of address bits; and
setting a second command to exit the PPR mode after latching the plurality of address bits that have been reproduced by encoding.

8. A method comprising:
receiving a plurality of first address bits;
receiving, in parallel to receiving the plurality of first address bits, a plurality of second address bits;
decoding the plurality of first address bits to produce a plurality of first decoded address bits;
decoding, in parallel to decoding the plurality of first address bits, the plurality of second address bits to produce a plurality of second decoded address bits;
programming the plurality of first decoded address bits into a plurality of first fuse circuits; and
programming, when programming the plurality of first decoded address has been finished, the plurality of second decoded address bits into a plurality of second fuse circuits.

9. The method of claim 8, wherein a number of the plurality of first address bits is equal to M, a number of the plurality of first decoded address bits being equal to N, a number of the plurality of second address bits being equal to K and a number of the plurality of second decoded address bits being equal to L;
wherein each of M and N is an integer of two or more and N is greater than M; and
wherein each of K and L is an integer of two or more and L is greater than K.

10. The method of claim 9, wherein M is equal to K and N is equal to L.

11. The method of claim 8, further comprising:
generating a first voltage before programming the plurality of first decoded address bits, and programming each of the plurality of first decoded address bits and each of the plurality of second address bits is executed by using the first voltage.

12. The method of claim 11, further comprising:
generating a second voltage different from the first voltage before programming the plurality of first decoded address bits, and programming each of the plurality of first decoded address bits and each of the plurality of second decoded address bits is executed by using the second voltage.

13. The method of claim 12, wherein generating the first voltage and generating the second voltage is executed substantially at the same time.

14. The method of claim 8, further comprising:
encoding the plurality of first decoded address bits programmed into the plurality of first fuse circuits to reproduce the plurality of first address bits;
encoding in parallel to encoding the plurality of first decoded address bits, the plurality of second decoded address bits programmed into the plurality of second fuse circuits to reproduce the plurality of second address bits;
latching the plurality of first address bits that have been reproduced by encoding; and
latching, in parallel to latching the plurality of first address bits, the plurality of second address bits that have been reproduced by encoding.

15. The method of claim 14, further comprising:
setting a first command to enter a PPR mode before decoding the plurality of first address bits and decoding the plurality of second address bits; and
setting a second command to exit the PPR mode after latching the plurality of first address bits that have been reproduced by encoding and latching the plurality of second address bits that have been reproduced by encoding.

16. The method of claim 8, wherein the plurality of first address bits are received as a portion of row address information and the plurality of second address bits are received as another portion of the row address information.

17. A method comprising:
receiving address information to access at least one word line, the address information is segmented into a plurality of address bit portions;
decoding the plurality of address bit portions to produce a plurality of decoded address bit portions, respectively; and
programming each of the plurality of decoded address bit portions into a corresponding one of a plurality of fuse circuits.

18. The method of claim 17, wherein one of the plurality of address bit portions includes M number of address bits and one of the plurality of decoded address bit portions corresponding to the one of the plurality of address bit portions includes N number of decoded address bits; and
wherein each of M and N is an integer of two or more and N is greater than M.

19. The method of claim 17, wherein decoding the plurality of address bit portions is executed in parallel.

20. The method of claim 19, wherein programming each of the plurality of decoded address bit portions is executed such that programming any one of the plurality of decoded address bit portions does not overlap programming another of the plurality of decoded address bit portions.

* * * * *